United States Patent
Kumar et al.

(10) Patent No.: US 8,908,814 B2
(45) Date of Patent: Dec. 9, 2014

(54) LOW LATENCY SIMD ARCHITECTURE FOR ITERATIVE DECODERS

(75) Inventors: Neelmani Kumar, Fremont, CA (US); Engling Yeo, San Jose, CA (US)

(73) Assignee: Marvell World Trade Ltd. (BB)

( * ) Notice: Subject to any disclaimer, the term of this patent is extended or adjusted under 35 U.S.C. 154(b) by 117 days.

(21) Appl. No.: 13/336,165

(22) Filed: Dec. 23, 2011

(65) Prior Publication Data

US 2012/0177152 A1 Jul. 12, 2012

Related U.S. Application Data

(60) Provisional application No. 61/430,653, filed on Jan. 7, 2011.

(51) Int. Cl.
*H04L 27/06* (2006.01)
*H03M 13/00* (2006.01)
*H03M 13/29* (2006.01)

(52) U.S. Cl.
CPC ...... *H03M 13/2957* (2013.01); *H03M 13/6561* (2013.01); *H03M 13/6569* (2013.01)
USPC .......................................... 375/341; 375/340

(58) Field of Classification Search
USPC ................................. 375/341, 340
See application file for complete search history.

(56) References Cited

U.S. PATENT DOCUMENTS

| | | | |
|---|---|---|---|
| 6,167,502 A * | 12/2000 | Pechanek et al. | 712/15 |
| 7,231,577 B2 | 6/2007 | Richardson et al. | |
| 7,346,832 B2 | 3/2008 | Richardson et al. | |
| 2009/0067554 A1 * | 3/2009 | Govindarajulu | 375/341 |
| 2009/0132893 A1 * | 5/2009 | Miyazaki et al. | 714/776 |
| 2010/0226443 A1 * | 9/2010 | Citta et al. | 375/240.26 |

FOREIGN PATENT DOCUMENTS

| | | |
|---|---|---|
| DE | 102 14 393 A1 | 2/2003 |
| EP | 0 973 292 A2 | 1/2000 |
| EP | 2 048 790 A1 | 4/2009 |

OTHER PUBLICATIONS

R. Cypher and J. L. C. Sanz, "SIMD Architectures and Algorithms for Image Processing and Computer Vision," IEEE Transactions on Acoustics, Speech and Signal Processing, vol. 37, No. 12, pp. 2158-2174, Dec. 1989.*

Yuan Lin, Scott Mahlke, Trevor Mudge, Chaitali Chakrabarti, Alastair Reid, Krisztian Flautner, "Design and Implementation of Turbo Decoders for Software Defined Radio," Proc. IEEE 2006 Workshop on Signal Processing Systems (SiPS).*

Myoung-Cheol Shin, In-Cheol Park, "SIMD Processor-Based Turbo Decoder Supporting Multiple Third-Generation Wireless Standards," IEEE Transactions on Very Large Scale Integration (VLSI) Systems, vol. 15, No. 7, Jul. 2007 pp. 801-810.*

Sangwon Seo, Trevor Mudge, Yuming Zhu, and Chaitali Chakrabarti, "Design and Analysis of LDPC Decoders for Software Defined Radio," IEEE Workshop on Signal Processing Systems (SiPS) 2007.*

(Continued)

*Primary Examiner* — Shuwang Liu
*Assistant Examiner* — Nader Bolourchi

(57) ABSTRACT

Systems, methods, and other embodiments associated with iterative decoders are described. According to one embodiment, an apparatus includes a set of decoders that are configured to receive data to be decoded. The apparatus may also include a controller configured to separately control each decoder to initiate a decoding sequence based on an occurrence of a transition point. The transition point is a global transition that occurs iteratively for the set of decoders and is based on iterations in a decoding sequence.

20 Claims, 6 Drawing Sheets

(56) References Cited

OTHER PUBLICATIONS

Patent Corporation Treaty (PCT) International Search Report and Written Opinion for co-pending PCT International Application No. PCT/US2011/067114 (International Filing Date Dec. 23, 2011) having a Date of Mailing of Mar. 28, 2012, 15 pgs.

* cited by examiner

LOW LATENCY SIMD ARCHITECTURE FOR ITERATIVE DECODERS

CROSS REFERENCE TO RELATED APPLICATIONS

This patent disclosure claims the benefit of U.S. Provisional Application No. 61/430,653 filed on Jan. 7, 2011, which is hereby wholly incorporated by reference.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Many forms of electronic communications use iterative functions when handling data. For example, when receiving communications in a wireless network a system may use iterative functions for error correction to help ensure the integrity of communicated data. However, in some systems, these functions can become a source of bottlenecks.

Bottlenecks can arise based on certain factors that lead to an increase in inefficiencies. For example, different communication channels may have different signal-to-noise ratios. Less complex systems that use a controller encounter exaggerated latencies when processing data from channels with different characteristics. On the other hand, while using a separate controller for each channel can mitigate this issue, more power is consumed and additional chip space is required for the extra controllers. Accordingly, both single and multiple controller approaches to iterative decoders suffer from disadvantages.

SUMMARY

In one embodiment an apparatus includes a set of decoders that are configured to receive data to be decoded. The apparatus may also include a controller configured to separately control each decoder to initiate a decoding sequence based on an occurrence of a transition point. The transition point is a global transition that occurs iteratively for the set of decoders and is based on iterations in a decoding sequence. In one embodiment, the controller is configured to shift a block of the data into a decoder from an associated buffer at the transition point if the buffer is full. The controller may also be configured to control a first decoder in the set of decoders to shutdown on an occurrence of a given transition point when a buffer associated with the first decoder has not received input from an associated channel for a predetermined period of time. Furthermore, in one embodiment, the controller is configured to separately control each decoder from the set of decoders by controlling a first decoder in the set of decoders to initiate a first decoding sequence on an occurrence of a first transition point and controlling a second decoder in the set of decoders to initiate a second decoding sequence on an occurrence of a second transition point that occurs after an iteration in the first decoding sequence while the first decoder is decoding.

In one embodiment, a method includes monitoring a set of channels associated with a set of decoders for data. The method includes separately controlling each decoder from the set of decoders to initiate a decoding sequence on the occurrence of a transition point that is a global transition that occurs iteratively for the set of decoders and is based on iterations in a decoding sequence. The method includes separately controlling each decoder to initiate a decoding sequence by shifting a block of the data into a decoder at one transition point to initiate the decoding sequence. The method also includes controlling a selected decoder to shutdown when the selected decoder does not receive input from a channel for a predetermined period of time and on an occurrence of a transition point.

The method includes separately controlling each decoder from the set of decoders by controlling a first decoder in the set of decoders to initiate a first decoding sequence on an occurrence of a first transition point and controlling a second decoder in the set of decoders to initiate a second decoding sequence on an occurrence of a second transition point that occurs after an iteration in the first decoding sequence while the first decoder is decoding.

In another embodiment, an integrated circuit includes a set of decoders wherein each decoder in the set of decoders is configured to receive data to be decoded from an associated channel. The integrated circuit includes a controller configured to separately control each decoder from the set of decoders to initiate a decoding sequence on an occurrence of a transition point, wherein the transition point is a global transition that occurs iteratively for the set of decoders and is based on iterations in a decoding sequence of at least one of the decoders in the set of decoders.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one example of the boundaries. In some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Described herein are example methods, apparatus, and other embodiments associated with a low-latency architecture for high throughput iterative decoders. In one embodiment, the architecture includes a single instruction, multiple data (SIMD) architecture. Processing latencies for iterative decoders are reduced by controlling a decoder to independently start a decoding sequence at a granularity of the iteration instead of waiting to initiate multiple decoders together. By introducing the ability for a decoder to start a new decoding sequence on the iteration while other decoders are within a decoding sequence, a maximum wait time is reduced to one iteration.

Accordingly, iterative decoders such as error correction decoders (e.g. Low Density Parity Check (LDPC) decoders, Soft Output Viterbi Algorithm (SOVA) decoders) can be implemented in a low-latency architecture with a single controller. The single controller operates with a finer granularity. In this way, such architectures as the SIMD architecture can be exploited for lower chip area and reduced complexity to implement a more time and power efficient approach to iterative decoding.

Figure 1:
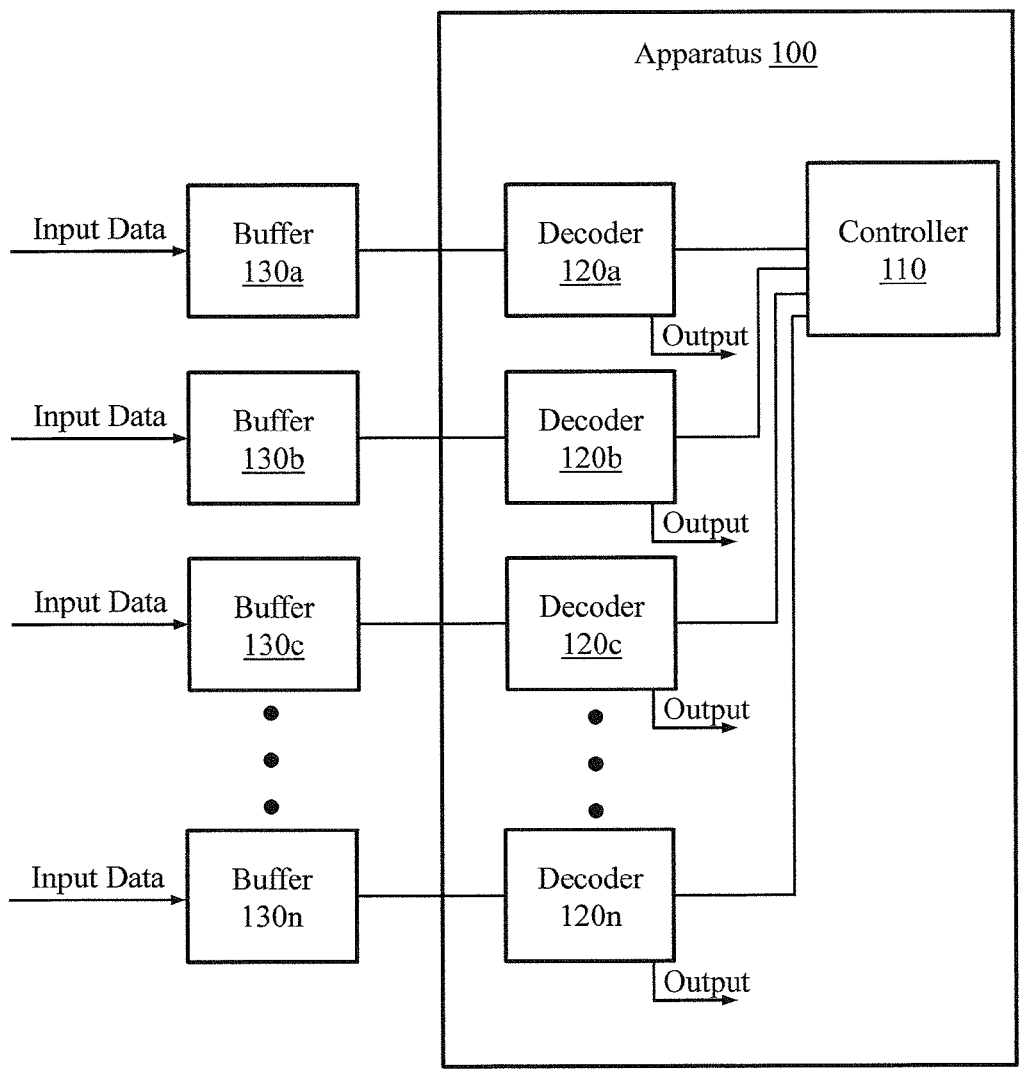
FIG. 1 illustrates one embodiment of an apparatus associated with a low latency architecture for high throughput iterative decoders.

With reference to FIG. 1, one embodiment of an apparatus 100 is shown for iterative decoding. In one embodiment, the apparatus 100 includes a controller 110 and a set of decoders 120a-120n. The set of decoders 120a-120n are, for example, each configured to receive blocks of data from an associated buffer 130a-130n. It should be appreciated that in other embodiments the set of decoders 120a-120n may be configured to receive inputs from a single buffer or a various number of buffers that are more or less numerous than the number of decoders. However, for purposes of this discussion, the set of decoders 120a-120n will be discussed as receiving input from one associated buffers 130a-130n, respectively (e.g., one buffer is connected to one decoder). Additionally, the set of buffers 130a-130n may, for example, receive input data from respective channels. In one embodiment, a channel may be, for example, a wireless networking channel, a wired networking channel, a system bus, or other electronic communication pathway. In one embodiment, the apparatus 100 provides a low-latency architecture for high throughput iterative decoders.

In one embodiment, the controller 110 is configured to separately control each decoder in the set of decoders 120a-120n. The controller 110 may separately control a decoder (e.g., decoder 120a) by initiating the decoder 120a to perform a decoding sequence on a block of data from buffer 130a. Controller 110 is configured to initiate the decoding sequence when a second decoder (e.g., decoder 120b) is in the process of decoding another block of data, but at a transition point between iterations. As will be described in more detail below, the decoding sequence includes multiple transition points and multiple iterations over time. In one embodiment, controller 110 separately controls each decoder at each iteration by providing an instruction to one decoder independent of instructions provided to other decoders. In this way, for example, the controller 110 may cause one decoder to begin a decoding sequence while causing another decoder to be turned off and yet another decoder to continue to the next iteration in a decoding sequence.

Separately controlling a decoder at the iteration provides for a finer granularity of control due to the frequent occurrence of iterations in the decoding sequence. A decoding sequence includes multiple iterations with each iteration including a set of operations. During the decoding sequence, a decoder iteratively performs the set of operations until, for example, a codeword is found. The iterations are separated by transition points that occur between each repetition of the set of operations. At these transition points, the controller 110 is configured to, for example, initiate one or more decoders in the set of decoders 120a-120n to begin decoding a block of data. In one example, the controller 110 initiates a decoder to begin decoding by shifting a block of data from a buffer into the decoder at a transition point.

In other embodiments, the controller 110 controls a decoder to perform a different action on the occurrence of a transition point. For example, the controller 110 may control a decoder to stop decoding a block of data, to continue decoding a block of data, to shutdown, and so on. In this way, the controller 110 is configured to reduce latencies associated with iterative decoding data by having a finer level of control of the set of decoders 120a-120n.

Figure 2:
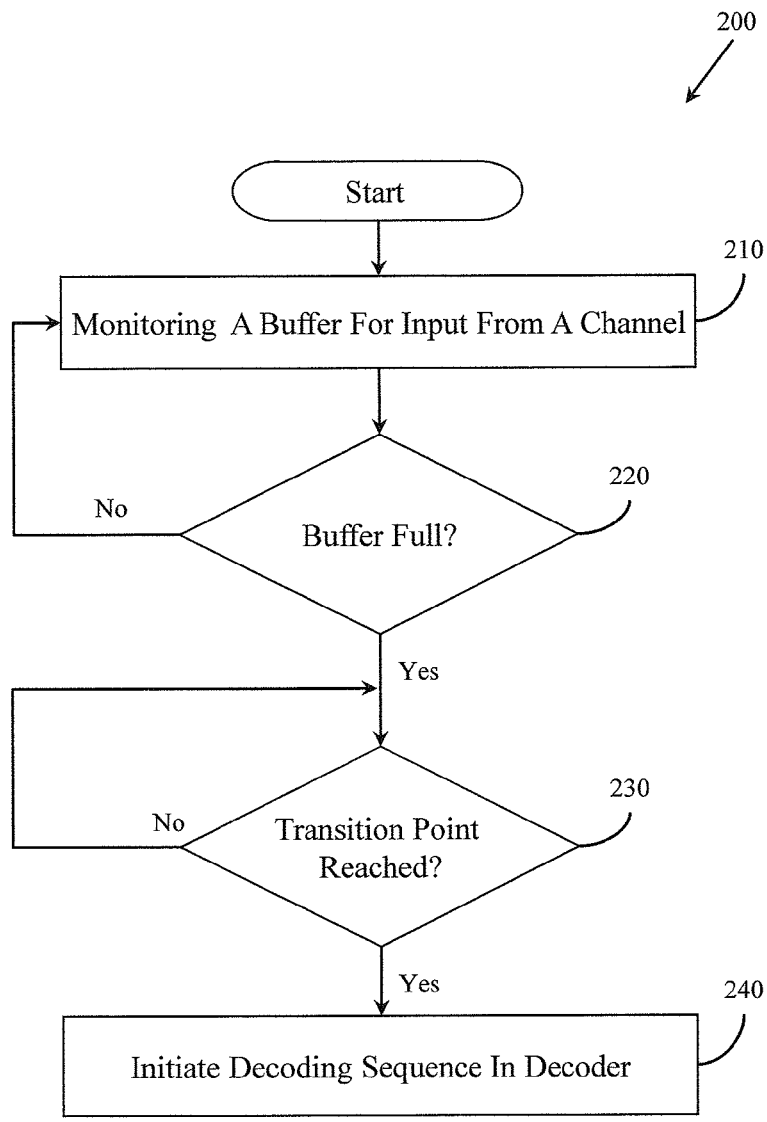
FIG. 2 illustrates one embodiment of a method associated with a low latency architecture for high throughput iterative decoders.

FIG. 2 illustrates one embodiment of a method 200 for low-latency iterative decoders. For purposes of the discussion of FIG. 2 reference to a decoder and a buffer refers to one decoder (e.g., decoder 120a) and one associated buffer (e.g., buffer 130a) as shown in FIG. 1 and not the set of decoders. However, it should be understood that method 200 may operate to control a plurality of decoders simultaneously. Additionally, in some embodiments, the controller 110 of FIG. 1 may be implemented to perform the method 200.

At 210, method 200 begins by monitoring a buffer associated with a decoder for input from a channel (e.g., a wireless channel). The input may be received in a buffer in pieces at random intervals of time. Thus, method 200 monitors the buffer to determine when to proceed to 220. Block 210 will be discussed in greater detail with reference to FIG. 3 and determining whether a buffer is inactive.

At 220, after input is received in the buffer, method 200 proceeds to determine if the buffer has a predetermined amount of data (e.g., is full or has reached a threshold level). In one embodiment, a full buffer equals one complete block of data to be decoded. At 220, if the buffer has not received the predetermined amount of data, method 200 proceeds back to 210 and continues to monitor for input. In one embodiment, the decoder may not begin a decoding sequence without a complete block of data. Thus, the method 200 monitors the buffer (at 210) and continuously determines whether the buffer is full (at 220). For example, the decoder (e.g., decoder 120a) may be configured to perform a decoding sequence on blocks of data that have a predefined length (e.g., 1944 bits in length). However, the bits of a block may be received in the buffer from a channel in partial chunks (e.g., 256 bits or 512 bits) and/or at random time intervals. Accordingly, to minimize wait times the buffer is monitored so that once it is full the method 200 may promptly proceed to the next decoding action.

Thus, at 220, if the buffer has the predetermined amount of data then method 200 proceeds to 230 so that the decoder may begin a decoding sequence on a complete block of data now in the buffer. However, before the decoder begins the decoding sequence the method 200 waits for a transition point to occur. Accordingly, at 230, method 200 determines whether a transition point has been reached. If processing is at a transition point, then method 200 proceeds to 240 where the decoder is initiated to begin the decode sequence. However, if a transition point has not been reached then the method 200 waits until a transition point occurs before proceeding to 240. Using transition points in this way provides, for example, the ability to use a single controller (e.g., controller 110) to control a plurality of decoders with finer granularity.

In one embodiment, the transition point is a global transition point that is, for example, based on a global clock. For example, the controller 110 (shown in FIG. 1) may operate according to method 200 to control the set of decoders 120a-120n in accordance with the global clock. In one embodiment, the controller 110 provides instructions to the set of decoders 120a-120n on the occurrence of a signal from the global clock. The global clock provides, for example, a periodic signal that occurs iteratively at a time that is a length of an iteration in a decoding sequence. In this way, controller 110 can independently control each decoder to change, maintain, start actions, and/or end action at the granularity of an iteration instead of an the end of an entire decoding sequence. For example, the controller 110 may initiate a first decoder to begin a decode sequence while a second decoder is transitioning from one iteration in a decoding sequence to the next iteration. Thus, controller 110 may, for example, control the decoder to perform actions independently of an action being performed by another decoder and without waiting to start a decoding process at the same time as other decoders.

Figure 3:
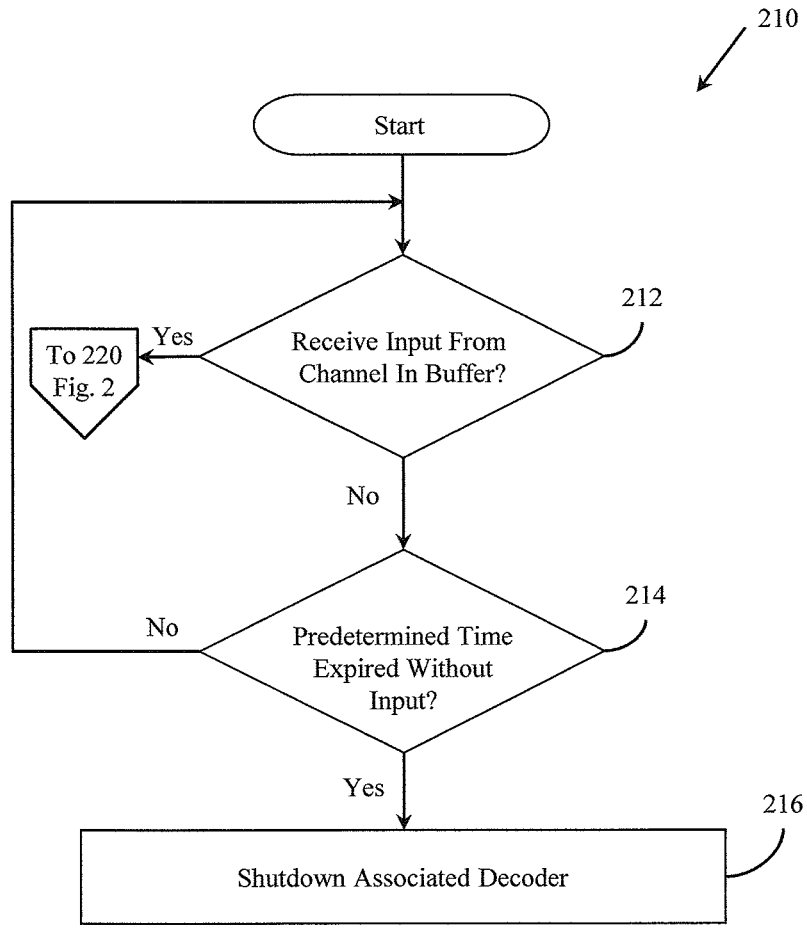
FIG. 3 illustrates one embodiment of a method associated with a low latency architecture for high throughput iterative decoders.

FIG. 3 illustrates a more detailed view of operations associated with monitoring a buffer as discussed at block 210 of method 200. In one embodiment, block 210 may include performing additional actions that, for example, reduce power consumption in an apparatus (e.g., apparatus 100). For example, at 212, the method 200 determines whether an input has been received in a buffer. As in 210 of FIG. 2, 212 proceeds to block 220 of FIG. 2 if an input has been received to determine if the buffer is full (e.g., a full block of data has been received). However, if the buffer does not receive an input then the method 200 proceeds to 214 to determine if the buffer is or has become inactive.

At 214, the method 200 checks a timer to determine whether a predetermined period of time has expired without the buffer receiving any input. At 214, if the timer has not expired then the method 200 proceeds back to 212 since the buffer has not yet reached a sufficient time period of inactivity to declare the buffer as inactive. However if the timer has expired, then the buffer is declared inactive, which also means that its associated decoder is inactive. Method 200 then proceeds to 216 where the decoder associated with the inactive buffer is shutdown. In this way, an inactive decoder in the apparatus (e.g., apparatus 100) can be identified and shut down to conserve power.

In other embodiments, when the timer expires at 214, the method 200 waits for a global transition point to occur before the decoder is shutdown. Since the global transition point occurs once per iteration, the decoder may be shutdown or restarted with a low-latency instead of waiting for an entire decoding sequence to complete.

Figure 4:
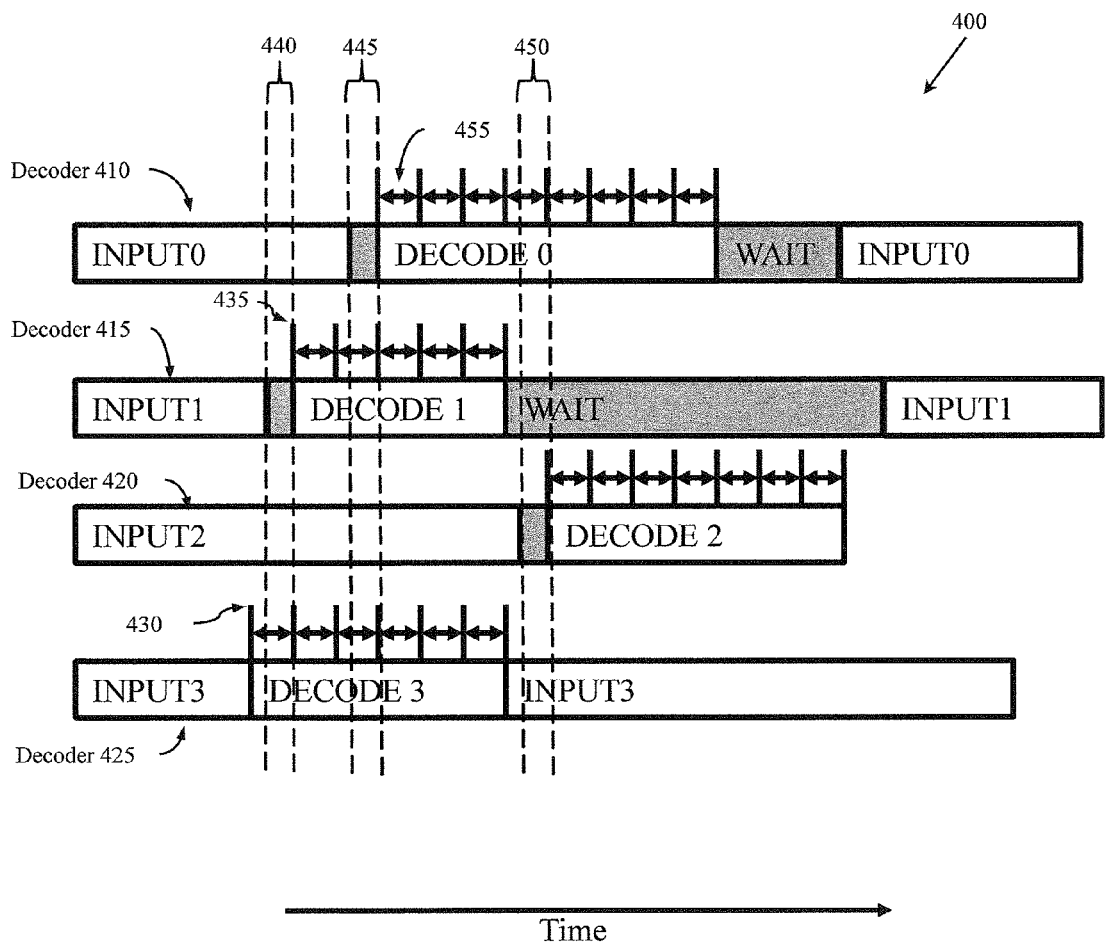
FIG. 4 illustrates one embodiment of a timing scheme associated with a low latency architecture for high throughput iterative decoders.

FIG. 4 will be discussed with reference to apparatus 100 from FIG. 1 and method 200 from FIG. 2. FIG. 4 illustrates a timing diagram 400 associated with a low latency architecture for iterative decoders. In FIG. 4, wait times for decoders are shown in grey, periods when buffers are receiving input are labeled with INPUT#, and periods when the decoder is performing a decoding sequence are labeled DECODE#.

FIG. 4 shows four separate time lines associated with four separate decoders 410, 415, 420, and 425, respectively (e.g., decoders 120a, 120b, 120c, and 120n from FIG. 1). At time point 430, for example, consider that a complete block of data (INPUT3) has filled the buffer for decoder 425. The controller (e.g., controller 110 of FIG. 1) separately controls decoder 425 to begin a decoding sequence DECODE3 on the INPUT3 data. Time 430 is the first occurrence of a global transition after the INPUT3 fills the buffer and when the controller may initiate the decoding sequence DECODE3 (e.g, 220 and 230 of FIG. 2 occur simultaneously). The next decoder with a full input buffer is decoder 415. However, INPUT1 completes filling its buffer between global transition points and therefore the decoder 415 waits until global transition 435 to initiate decoding sequence DECODE1. Here, the decoder 415 waits part of an iteration 440 to begin the decoding sequence DECODE1 since the buffer is found to be full between transition points.

Similar to decoder 415, decoders 410 and 420 wait only a partial iteration time 445 and 450, respectively, before initiating decode sequences DECODE0 and DECODE2 after they receive a complete block of data INPUT0 and INPUT2, respectively. In this way, the global transition points decrease the latencies of each decoder by providing for a finer granularity of control. It should be noted that the wait times labeled as "WAIT" illustrated after DECODE0 and DECODE1 are buffer input wait times that are dependent on receiving input from a channel and are not wait times associated with waiting to initiate a decoder from a global transition point as in the case of time periods 440, 445, and 450.

Figure 5:
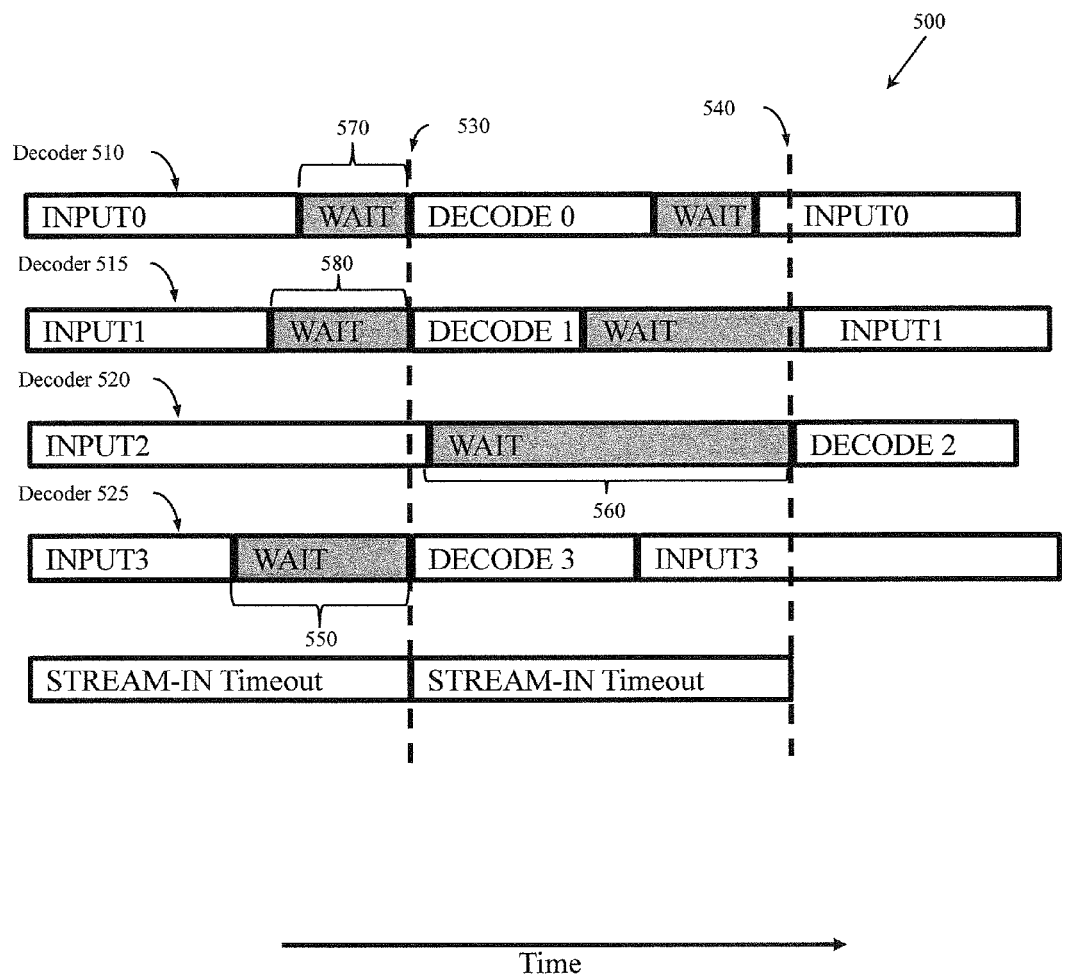
FIG. 5 illustrates one embodiment of a timing scheme associated with error correction decoding.

FIG. 5 illustrates a timing scheme 500 that does not use global transition points but rather initiates decoding simultaneously for a set of decoders. FIG. 5 will be discussed in contrast to FIG. 4 to show examples of how the technique of FIG. 4 reduces decoding latencies. For example, FIG. 4 illustrates controlling decoders using a global transition point versus FIG. 5 which illustrates initiating decoders only after a universal STREAM-IN timeout period. To contrast the figures, first consider that in FIG. 5 separate decoders 510, 515, 520, and 525 do not begin a decoding sequence independently as in FIG. 4. Instead in FIG. 5, decoding begins only on the expiration of the STREAM-IN timeout. The STREAM-IN timeout is a pre-selected time that is intended to encompass a maximum time needed to receive input and also a maximum time needed to perform a decoding sequence on the input. When the STREAM-IN timeout expires at time point 530, all decoders that are waiting to begin a decoding sequence (e.g., decoders 510, 515, and 525) are initiated simultaneously. If a decoder (e.g., decoder 520) has not received its full input (INPUT2) and thus is not ready to decode on the expiration of the STREAM-IN timeout, the decoder 520 must wait until the next STREAM-IN timeout period expires at time 540 before decoding begins (e.g., after a wait period 560).

In some embodiments, using the STREAM-IN timeout leads to exaggerated wait times and increased latencies in decoding. Additionally, even though buffers for decoders 510, 515, and 525 are full before the expiration of the initial STREAM-IN timeout at time 530, wait times such as wait 550 occur due to longer times to reach decoding initiation points 530 and 540. For timing scheme 500 in FIG. 5, the maximum wait time is an entire STREAM-IN timeout. Additionally, in one embodiment, even though STREAM-IN timeout is intended to encompass a maximum decoding time for any given channel, some channels with poor signal to noise ratios may use more time than the STREAM-IN timeout to decode. When a channel is still decoding on the occurrence of the expiration of the STREAM-IN timeout a new decoding sequence (e.g., INPUT0, INPUT1, and INPUT 3 at 530) cannot start. Accordingly, wait times can become even more exaggerated since the decoders then wait till the next expiration of the STREAM-IN timeout when no other decoders are in a decoding sequence to begin.

By contrast, in FIG. 4 the maximum wait time is one decoding iteration (e.g., time period 455) in a decoding sequence. For example, consider the wait times to begin decoding sequences from FIG. 4 versus those from FIG. 5. In FIG. 4, the wait times are represented by 440, 445, and 450 whereas in FIG. 5 they are represented by 550, 560, 570, and 580. The scheme 400 illustrated in FIG. 4 has lower latencies than those in the scheme 500 of FIG. 5.

Figure 6:
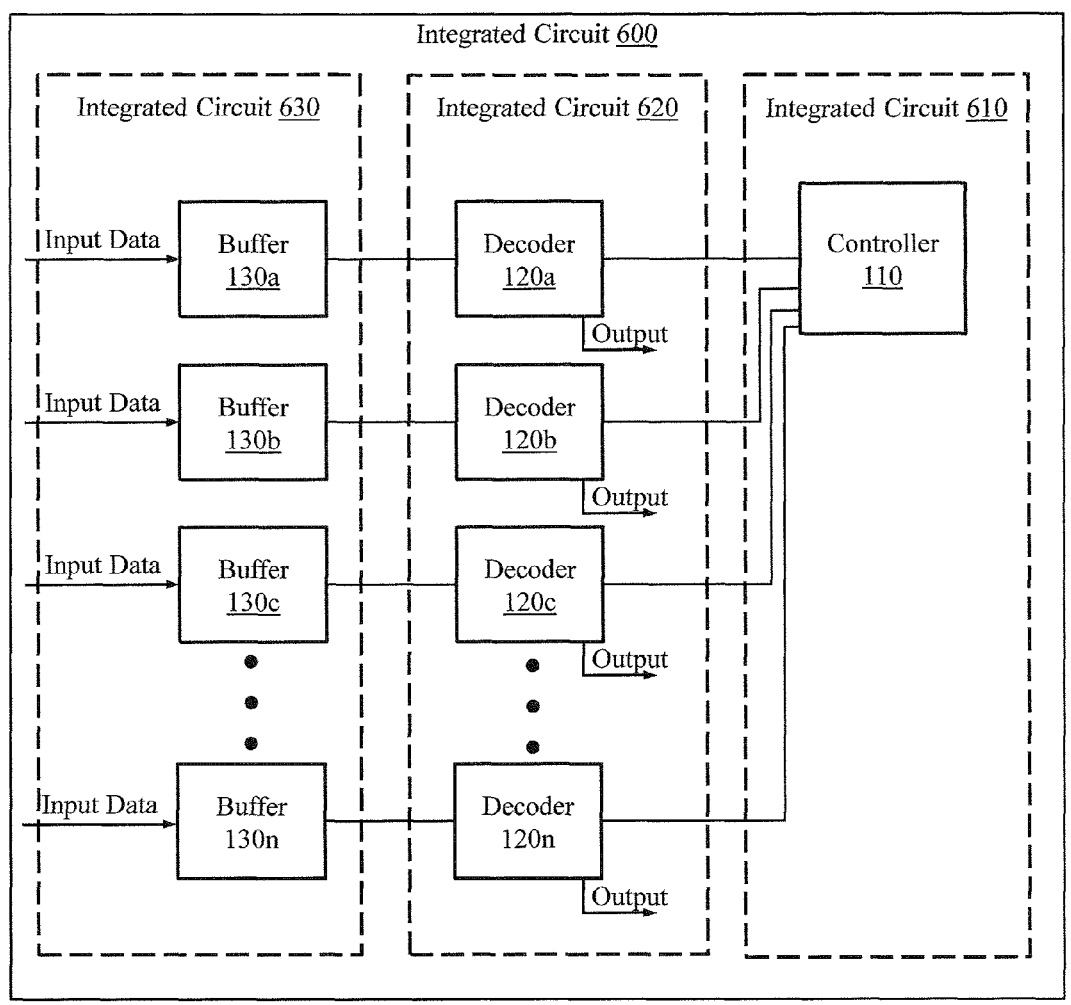
FIG. 6 illustrates one embodiment of an integrated circuit associated with a low latency architecture for high throughput iterative decoders.

FIG. 6 illustrates another embodiment of the apparatus 100 from FIG. 1 that is configured with separate integrated circuits and/or chips. In this embodiment, the controller 110 from FIG. 1 is embodied as a separate integrated circuit 610. Additionally, the set of decoders 120a-120n are embodied on an individual integrated circuit 620. The set of buffers 130a-130n are also embodied on an individual integrated circuit 630. The circuits are connected via connection paths to communicate signals. While integrated circuits 610, 620, and 630 are illustrated as separate integrated circuits, they may be integrated into a common integrated circuit board 600 or chip. In one embodiment, the integrated circuit board 600 is, for example, a Network Interface Card (NIC), a wireless NIC, a storage device controller, and so on.

Additionally, integrated circuits 610, 620, and 630 may be combined into fewer integrated circuits or divided into more integrated circuits than illustrated. In another embodiment, the set of decoders 120a-120n and the controller 110 illustrated in integrated circuits 620 and 610 may be combined into a separate application specific integrated circuit. In still other embodiments, the functionality associated with the set of decoders 120a-120n and the controller 110 may be embodied as firmware executable by a processor. In one embodiment, the set of decoders 120a-120n are Low Density Parity Check (LDPC) decoders, Turbo decoders, a combination of Soft Output Viterbi Algorithm (SOVA) decoders and LDPC decoders and so on. In further embodiments, the integrated circuits 610 and 620 may be a single instruction, multiple data (SIMD) processor.

Furthermore, in one embodiment, integrated circuit 630 may include only a single buffer that is connected to each decoder in the set of decoders 120a-120n. For example, the number of buffers in the set of buffers 130a-130n may vary in number by more or less than the number of decoders in the set of decoders 120a-120n. In an embodiment where there are more buffers than the number of decoders, one or more decoders may have multiple inputs. Likewise, in an embodiment where there are less buffers than the number of decoders, one or more buffers may share a decoder.

The following includes definitions of selected terms employed herein. The definitions include various examples and/or forms of components that fall within the scope of a term and that may be used for implementation. The examples are not intended to be limiting. Both singular and plural forms of turns may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, instructions stored on a non-transitory medium or in execution on a machine, and/or combinations of each to perform a function(s) or an action(s), and/or to cause a function or action from another logic; method, and/or system. Logic may include a programmed microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. An apparatus, comprising:
a set of decoders, wherein each decoder in the set of decoders is configured to decode a separate block of data according to a decoding sequence that includes a plurality of decoding iterations; and
a controller configured to control each decoder from the set of decoders to independently initiate decoding while at least one other decoder in the set of decoders is decoding, wherein the controller is configured to independently initiate decoding according to a transition point that aligns with separate iterations in respective decoding sequences between the set of decoders, wherein the controller is configured to generate the transition point iteratively at iterations in the respective decoding sequences as a global transition for controlling the set of decoders to begin each iteration in the respective decoding sequences together and
wherein the controller is configured to control each decoder of the set of decoders to independently initiate separate decoding sequences at different successive transition points by controlling the set of decoders together using the transition points, and wherein the apparatus is a single input multiple data (SIMD) processor.

2. The apparatus of claim 1, wherein the controller is configured to shift a block of the data into a decoder from an associated buffer at the transition point if the buffer is full to initiate the decoding sequence, and wherein the block of data is a complete block of data associated with the decoder.

3. The apparatus of claim 1, wherein the controller is configured to initiate a first decoder to decode a first block of the data while a second decoder is decoding a second block of the data, and wherein the controller is configured to monitor a buffer for the first block of data and to independently initiate the first decoder to decode upon detecting that the first block of data is complete in the buffer.

4. The apparatus of claim 1, wherein the controller is configured to control a first decoder in the set of decoders to shutdown on an occurrence of a given transition point when a buffer associated with the first decoder has not received input from an associated channel for a predetermined period of time.

5. The apparatus of claim 1, wherein the controller is configured to separately control each decoder from the set of decoders by:
controlling a first decoder in the set of decoders to initiate a first decoding sequence on an occurrence of a first transition point and controlling a second decoder in the set of decoders to initiate a second decoding sequence on an occurrence of a second transition point that occurs after an iteration in the first decoding sequence while the first decoder is decoding.

6. The apparatus of claim 1, wherein the set of decoders are Low Density Parity Check (LDPC) decoders, Turbo decoders, or combined Soft Output Viterbi Algorithm (SOVA) and LDPC decoders, wherein the apparatus is integrated with a Network Interface Card (NIC), and wherein the controller is configured to decode the separate block of data until a codeword is found and not limit the plurality of iterations to a predefined number.

7. The apparatus of claim 5, wherein the second decoding sequence is for a different block of data received from a different channel than the first decoding sequence, and wherein the controller is configured to separately control each decoder using the global transition while one or more of the set of decoders are decoding.

8. A method, comprising:
monitoring a set of buffers associated with a set of decoders for data, wherein each decoder from the set of decoders decodes a separate block of data according to a respective decoding sequence that includes a plurality of decoding iterations; and
controlling, within a single input multiple data (SIMD) processor, each decoder from the set of decoders to independently initiate decoding while at least one other decoder in the set of decoders is decoding, wherein independently initiating decoding includes initiating according to a transition point that aligns with separate iterations in respective decoding sequences between the set of decoders, wherein controlling each decoder includes generating the transition point iteratively at iterations in the respective decoding sequences as a global transition for controlling the set of decoders to begin each iteration in the respective decoding sequences together, and
wherein controlling each decoder includes controlling each decoder in the set of decoders to independently initiate separate respective decoding sequences at successive transition points by controlling the set of decoders together using the transition point.

9. The method of claim 8, wherein separately controlling each decoder to initiate a decoding sequence includes shifting a block of the data into a decoder at one transition point to initiate the decoding sequence, wherein the block of data is a complete block of data from a buffer associated with the decoder.

10. The method of claim 8, wherein controlling each decoder includes independently initiating a first decoder to decode a first block of data while a second decoder is decoding a second block of data and wherein monitoring the set of buffers includes monitoring for the first block of data and independently initiating the first decoder to decode upon detecting that the first block of data is complete in one of the set of buffers.

11. The method of claim 8, further comprises controlling a selected decoder to shutdown when the selected decoder does not receive input from a channel for a predetermined period of time and on an occurrence of a transition point.

12. The method of claim 8, wherein separately controlling each decoder from the set of decoders comprises:
controlling a first decoder in the set of decoders to initiate a first decoding sequence on an occurrence of a first transition point and controlling a second decoder in the set of decoders to initiate a second decoding sequence on an occurrence of a second transition point that occurs after an iteration in the first decoding sequence while the first decoder is decoding, wherein the second decoding sequence is for a different block of data received from a different channel than the first decoding sequence, and wherein separately controlling each decoder includes initiating one or more of the set of decoders using the global transition while one or more of the set of decoders are decoding.

13. The method of claim 8, wherein monitoring a set of channels associated with a set of decoders for data includes monitoring a set of buffers associated with the set of decoders and wherein separately controlling each decoder includes initiating a decoder to begin a decoding sequence on the occurrence of a transition point if an associated buffer has received a predetermined amount of data and wherein controlling each decoder includes controlling each decoder to decode a respective separate block of data until the respective block of data is decoded by not limiting the plurality of iterations to a predefined number.

14. An integrated circuit, comprising:
a set of decoders, wherein each decoder in the set of decoders is configured to decode a separate block of data according to a decoding sequence that includes a plurality of decoding iterations; and
a controller configured to control each decoder from the set of decoders to independently initiate decoding while at least one other decoder in the set of decoders is decoding, wherein the controller is configured to independently initiate decoding according to a transition point that aligns with separate iterations in respective decoding sequences between the set of decoders, wherein the controller is configured to generate the transition point iteratively at iterations in the respective decoding sequences as a global transition for controlling the set of decoders to begin each iteration in the respective decoding sequences together, and
wherein the controller is configured to control each decoder of the set of decoders to independently initiate separate decoding sequences at different successive transition points by controlling the set of decoders together using the transition points, and wherein the integrated circuit is a single input multiple data (SIMD) processor.

15. The integrated circuit of claim 14, wherein the controller is configured to shift a block of the data into a decoder of the set of decoders at a transition point to initiate the decoding sequence, and wherein the block of data is a complete block of data from a respective buffer associated with the decoder.

16. The integrated circuit of claim 15, wherein the controller is configured to shift the block of the data into a decoder from an associated buffer at a transition point if the buffer is full, wherein each decoder in the set of decoders is configured to receive data from an associated channel through an associated buffer.

17. The integrated circuit of claim 14, wherein the controller is configured to initiate a first decoder to decode a first block of the data while a second decoder is decoding a second block of the data and wherein the controller is configured to decode the separate block of data until a codeword is found and not limit the plurality of iterations to a predefined number.

18. The integrated circuit of claim 14, wherein the controller is configured to control a decoder in the set of decoders to shutdown on an occurrence of a transition point when the decoder has not received input from an associated channel for a predetermined period of time.

19. The integrated circuit of claim 14, wherein the controller is configured to separately control each decoder from the set of decoders by:
controlling a first decoder in the set of decoders to initiate a first decoding sequence on an occurrence of a first transition point and controlling a second decoder in the set of decoders to initiate a second decoding sequence on an occurrence of a second transition point that occurs after an iteration in the first decoding sequence while the first decoder is decoding, wherein the second decoding sequence is for a different block of data received from a different channel than the first decoding sequence, and wherein the controller is configured to separately control each decoder using the global transition while one or more of the set of decoders are decoding.

20. The integrated circuit of claim 14, wherein the global transition is a clock that tracks iterations in a decoding sequence and the controller is configured to control each decoder to independently initiate decoding based, at least in part, on the clock.

\* \* \* \* \*